United States Patent [19]
Watanabe et al.

[11] Patent Number: 6,020,791
[45] Date of Patent: Feb. 1, 2000

[54] APPARATUS AND METHOD FOR ADJUSTING TEMPERATURE COMPENSATED QUARTZ OSCILLATOR

[75] Inventors: Yasushi Watanabe, Shizuoka; Takehiko Hayashi, Kanagawa, both of Japan

[73] Assignee: Matsushita Electric Industrial Co., Ltd., Osaka, Japan

[21] Appl. No.: 09/064,487

[22] Filed: Apr. 22, 1998

[30] Foreign Application Priority Data

Apr. 25, 1997 [JP] Japan ................................ 9-109157

[51] Int. Cl.⁷ .............................. H03B 5/04; H03B 5/32; H03B 5/36
[52] U.S. Cl. .............................. 331/66; 331/44; 331/158; 331/177 V; 310/315; 29/593
[58] Field of Search .......................... 331/44, 66, 116 R, 331/116 FE, 158, 176, 177 V; 310/315, 318; 29/593

[56] References Cited

U.S. PATENT DOCUMENTS

| | | | |
|---|---|---|---|
| 4,746,879 | 5/1988 | Ma et al. | 331/44 |
| 4,967,165 | 10/1990 | Lee et al. | 331/66 |
| 5,392,005 | 2/1995 | Bortoline et al. | 331/44 |
| 5,705,957 | 1/1998 | Oka et al. | 331/66 |

FOREIGN PATENT DOCUMENTS

| | | |
|---|---|---|
| 720298 | 7/1996 | European Pat. Off. . |
| 42 09 843 | 11/1993 | Germany . |
| 8-506466 | 7/1996 | Japan . |

*Primary Examiner*—David Mis
*Attorney, Agent, or Firm*—Pearne, Gordon, McCoy & Granger LLP

[57] ABSTRACT

The frequency of a quartz oscillator having a trimmer 2, a quartz oscillator 3 on which its temperature characteristic is printed in the form of a bar code 6, and a storage device 4 is adjusted to a predetermined frequency, and the temperature at that time is measured by a noncontact temperature sensor of a frequency adjusting device 10, and is written into the storage device 4. The temperature characteristic of the quartz oscillator is read by a bar code reader 21, and optimally suited temperature compensating data is selected from among a plurality of pieces of temperature compensating data stored in advance in a temperature-compensating-data writing device. Further, a frequency deviation between the temperature at the time of adjustment and a standard temperature is calculated, and the temperature compensating data including that frequency deviation is stored in the storage device 4. The temperature characteristic of the quartz oscillator is compensated on the basis of the temperature compensating data corrected for the frequency deviation.

8 Claims, 2 Drawing Sheets

APPARATUS AND METHOD FOR ADJUSTING TEMPERATURE COMPENSATED QUARTZ OSCILLATOR

BACKGROUND OF THE INVENTION

1. Field of the Invention

The present invention relates to an apparatus and a method for adjusting a temperature compensated quartz oscillator which are capable of obtaining a smooth frequency characteristic in a wide temperature range of −20° C. to 60° C.

2. Description of the Related Art

Conventionally, a quartz oscillator used in, for example, a portable telephone terminal and the like is formed as a module structure, and the oscillator itself is provided with a temperature compensating circuit for directly compensating a frequency shift due to the temperature of the quartz oscillator so as to stabilize the frequency in a wide temperature range through hardware. Namely conventional module has a circuit directly compensating a temperature characteristic within the module, and without controlling a CPU. Accordingly, it is thought that the quartz oscillator of this pattern conventionally required only frequency adjustment at normal temperature, and did not require adjustment concerning the temperature characteristic.

However, the above-described conventional temperature compensated quartz oscillator does not necessarily operate to accurately compensate the temperature characteristic of the quarts oscillator due to the variation of a temperature compensating circuit and the quartz oscillator of the oscillator, so that the yield in production has been poor, resulting in higher price.

SUMMARY OF THE INVENTION

The present invention is aimed to overcome the above-described drawbacks of the conventional art, and its object is to provide an excellent apparatus and method for adjusting a temperature compensated quartz oscillator which is capable of absorbing variations in the temperature characteristic of individual quarts oscillators and frequency deviations due to the temperature at the time of adjustment.

To attain the above object, in the present invention, quartz-temperature compensating data of tens of patterns are provided in advance on the apparatus for adjusting the oscillator, and even if a quartz oscillator having any temperature characteristic is mounted in a portable telephone terminal, a bar code on the quartz oscillator is read, and temperature compensating data which is optimally suited for compensating the characteristic is written into the portable telephone terminal on the basis of the temperature characteristic information in the bar code. In addition, the temperature at the time of frequency adjustment is measured, a frequency deviation from a standard temperature of 25° C. is calculated, and a correction value corresponding to that deviation, together with the temperature compensating data, is written.

A first aspect of the apparatus is an apparatus for adjusting a temperature compensated quartz oscillator device having: a variable capacity element; a quartz oscillator on which a temperature characteristic information thereof is displayed; and a storage device, comprising;

a frequency adjusting device having a temperature sensor for measuring the temperature of said quartz oscillator at a time when the frequency of said quartz oscillator is adjusted to a predetermined frequency by said variable capacity element, the measured temperature of said quartz oscillator being stored in said storage device; and a temperature-compensating-data writing device having a means for reading the displayed information; and a plurality patterns of standard temperature-compensating-datum, said temperature-compensating-data writing device being arranged to select temperature compensating data optimally suited to the temperature characteristic of said quartz oscillator which has been read by said reading means, to calculate a frequency deviation caused by the difference between the temperature of said quartz oscillator at the time of adjustment thereof and a standard temperature by means of a calculating means, and to cause the temperature compensating data including the frequency deviation to be stored in said storage device, wherein the temperature characteristic of said quartz oscillator is compensated on the basis of the temperature compensating data corrected for the frequency deviation.

A second aspect of the apparatus is an apparatus for adjusting a temperature compensated quartz oscillator device, according to the first aspect, wherein said quartz oscillator has a temperature characteristic information thereof is printed in advance in the form of a bar code, and the reading means is a bar code reader.

A third aspect of the apparatus is an apparatus for adjusting a temperature compensated quartz oscillator device, according to the first aspect, wherein the temperature sensor is a noncontact temperature sensor.

A fourth aspect of the apparatus is an apparatus for adjusting a temperature compensated quartz oscillator device, according to the first aspect, wherein the calculating means is incorporated in said temperature-compensating-data writing device.

A fifth aspect of the apparatus is a temperature compensated quartz oscillator device comprising:

a variable capacity element, a quartz oscillator on which a temperature characteristic information thereof is displayed; and a storage device to be stored a temperature of said quartz oscillator at a time when the frequency of said quartz oscillator is adjusted to a predetermined frequency by said variable capacity element, wherein by selecting a temperature compensating data optimally suited to the temperature characteristic of said quartz oscillator, based on the displayed temperature characteristic information, and calculating a frequency deviation between the temperature of said quartz oscillator at the time of adjustment thereof and a standard temperature by means of a calculating means, the temperature characteristic of said quartz oscillator is compensated on the basis of the temperature compensating data corrected for the frequency deviation caused by the difference between the temperature of said quartz oscillator at the time of adjustment thereof and the standard temperature.

A sixth aspect of the device is a temperature compensated quartz oscillator device according to the fifth aspect, wherein the temperature compensated quartz oscillator device is mounted in a portable telephone terminal.

A seventh aspect of the method is a method for adjusting a temperature compensated quartz oscillator device, having: a variable capacity element; a quartz oscillator on which a temperature characteristic information thereof is displayed; and a storage device, comprising the steps of:

setting the frequency of a quartz oscillator to a predetermined frequency by adjusting a variable capacity element;

measuring the temperature of a quartz oscillator at the time of that adjustment;

reading a temperature characteristic of said quartz oscillator from the temperature characteristic information thereof displayed on said quartz oscillator; and selecting temperature compensating data, which is optimally suited to the temperature characteristic of said quartz oscillator, on the basis of a plurality of patterns of the temperature compensating data stored in advance;

calculating a frequency deviation caused by the difference between the temperature of said quartz oscillator at the time of adjustment thereof and a standard temperature; and compensating the temperature characteristic of said quartz oscillator on the basis of the temperature compensating data corrected for the frequency deviation.

A eighth aspect is a method according to the seventh aspect, wherein the reading step comprising a step of reading the temperature characteristic information thereof displayed on said quartz oscillator as a bar code.

Accordingly, in accordance with the above-described configuration, advantages are obtained in that even if a quartz oscillator having any temperature characteristic is mounted in a portable telephone terminal, it is possible to provide temperature compensation suitable for that quartz oscillator, and that even if frequency adjustment is made at any temperature, it is possible to adjust the quartz oscillator which undergoes a small frequency deviation in a wide temperature range.

DESCRIPTION OF A PREFERRED EMBODIMENT

Figure 1:
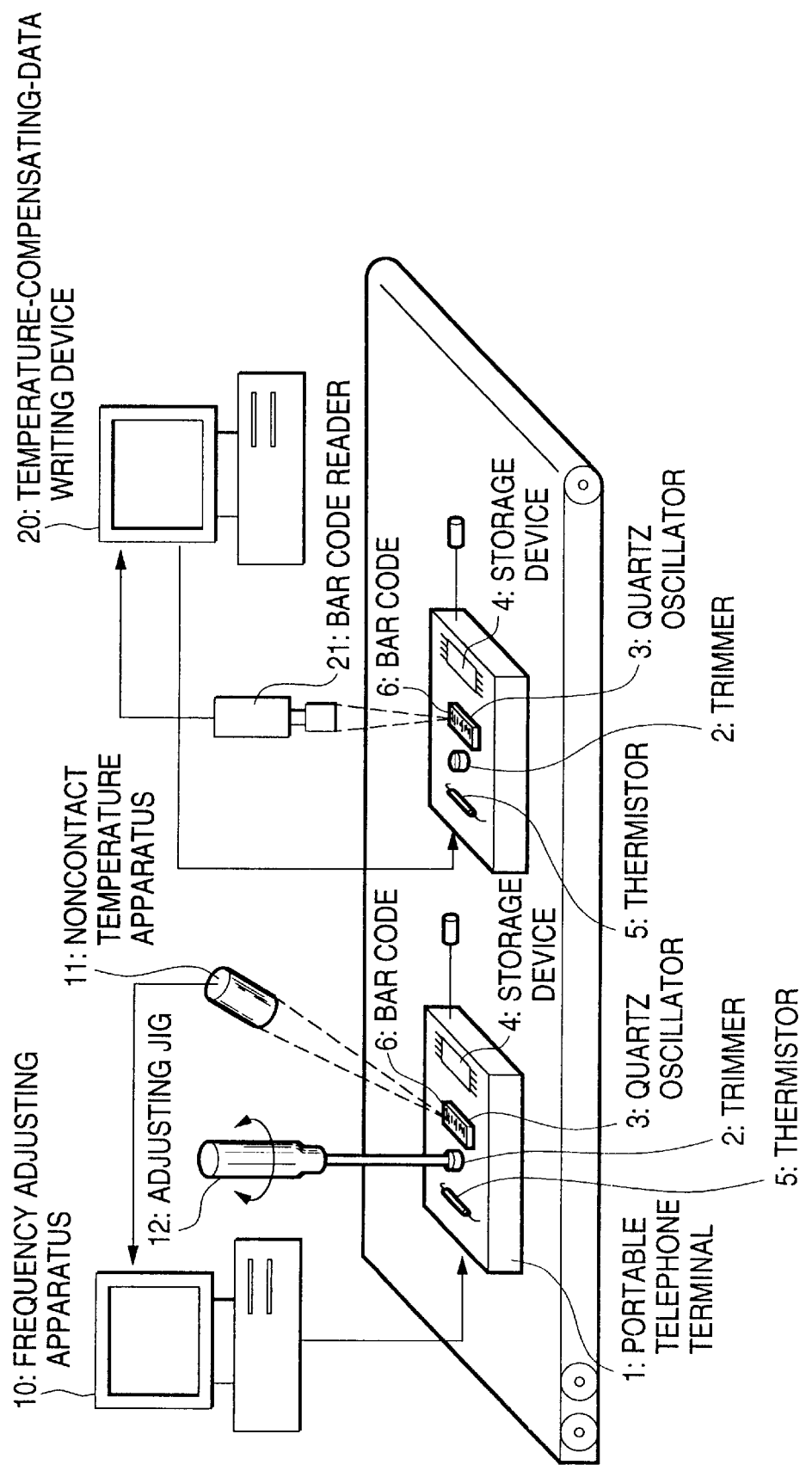
FIG. 1 is a diagram illustrating a frequency adjusting apparatus and a temperature-compensating-data writing device in accordance with an embodiment of the present invention.

Referring now to the drawings, a detailed description will be given of an embodiment of the present invention.

FIG. 1 shows a means for adjusting a quartz oscillator in accordance with an embodiment of the present invention, in which reference numeral 1 denotes a portable telephone terminal on which a trimmer 2, a quartz oscillator 3, a storage device 4, a thermistor 5, and the like are mounted. It should be noted that a bar code 6 including information on the temperature characteristic of the quartz oscillator 3 is printed on the quartz oscillator 3.

Reference numeral 10 denotes a frequency adjusting device serving as the means for adjusting the quartz oscillator, and the frequency adjusting device 10 has a noncontact temperature sensor 11 for measuring the surface temperature of the quartz oscillator 3 at the time of the frequency adjustment. In addition, reference numeral 20 denotes a temperature-compensating-data writing device, which has a bar code reader 21 for reading the bar code printed on the quartz oscillator 3.

Next, a description will be given of the operation in this embodiment. First, the frequency adjustment of the quartz oscillator is effected by the frequency adjusting device 10. The trimmer 2 is rotated by using an adjusting jig 12 such as a screwdriver so as to adjust the frequency to a predetermined level. At that juncture, the surface temperature of the quartz oscillator 3 at the time of adjustment is measured by means of the noncontact temperature sensor 11, and that information is written into the storage device 4 of the portable telephone terminal 1.

In the next step, the temperature characteristic information written in the bar code 6 on the quartz oscillator 3 is read by the bar code reader 21, and is inputted to the temperature-compensating-data writing device 20, which in turn extracts optimum temperature compensating data from among the temperature compensating data of a plurality of patterns stored in advance. Further, the temperature information measured by the noncontact temperature sensor 11 at the time of adjustment and stored in the storage device 4 is read, and a frequency deviation with the frequency at the time of adjustment at a standard temperature of 25° C. is calculated to determine a correction value. The temperature compensating data extracted above is corrected by that correction value, and the corrected temperature compensating data is written into the storage device 4 of the portable telephone terminal 1.

In the portable telephone terminal 1, the quartz oscillator generates a signal having a frequency controlled through a control circuit (software) on the basis of the temperature information detected by the thermistor 5 and the temperature compensating data written in the storage device 4, so as to effect temperature compensation. Namely in the control circuit, based on the basis of the temperature information detected by the thermistor 5 and the temperature compensating data written in the storage device 4, CPU calculates an optimum voltage compensated to be applied to the quartz oscillator through a D/A converter.

Figure 2:
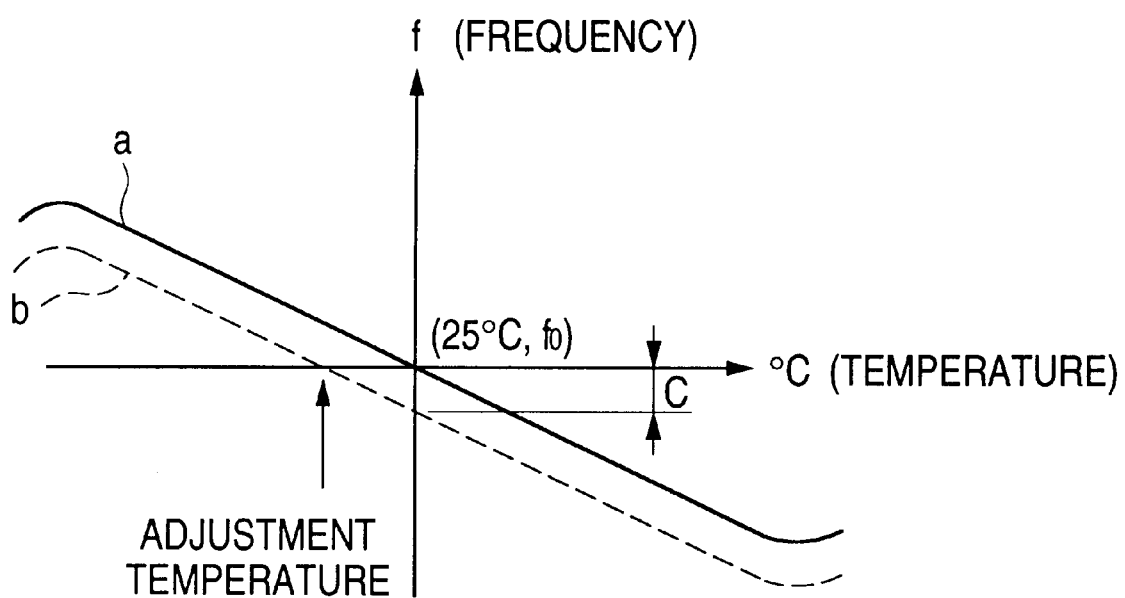
FIG. 2 is a conceptual diagram of a method for determining a correction value on the basis of a predetermined temperature characteristic of a quartz oscillator at 25° C. and a temperature characteristic at a time when the adjustment temperature has deviated from 25° C. in accordance with the embodiment.

FIG. 2 shows a method for determining a correction value on the basis of the predetermined temperature characteristic of the quartz oscillator at the standard temperature 25° C. and the temperature characteristic at a time when the adjustment temperature has deviated from 25° C. In the drawing, a shows the frequency characteristic of the quartz oscillator at the time of standard adjustment at 25° C., while b shows the frequency characteristic of the quartz oscillator at the time of arbitrary adjustment, and the frequency deviation c between them is determined. By using this frequency deviation c as a correction value, the temperature correcting data is corrected.

In accordance with this embodiment configured as described above, since the information on the temperature characteristic of the quartz oscillator 3 written individually in the bar code 6 is read, it is possible to select optimum temperature compensating data for the quartz oscillator 3. In addition, even if adjustment is made under any temperature environment, by measuring the temperature at that time by the noncontact temperature sensor 11, the frequency deviation c with the frequency at the time of measurement at the standard temperature of 25° C. is determined, and the temperature compensating data is corrected by using this frequency deviation c as the correction value. Accordingly, it is possible to obtain a quartz oscillator which undergoes a small temperature deviation in all the temperature range (−20° C. to 60° C.).

As described above, in accordance with the present invention, since the temperature compensating data for the quartz oscillator is stored in advance in the adjusting means, an advantage is offered in that a quartz oscillator excelling in the temperature characteristic can be obtained by writing in advance the temperature compensating data, which is optimally suited to the individual quartz oscillator mounted in the portable telephone terminal, into the portable telephone terminal and by controlling the same through software. Further, since the frequency deviation based on the difference between the temperature at the time of frequency adjustment and the standard temperature is corrected by determining the frequency deviation by measuring the temperature at the time of adjustment, an advantage is offered in that the quartz oscillator can be adjusted to be provided with a small frequency deviation at any temperature.

What is claimed is:

1. An apparatus for adjusting a temperature compensated quartz oscillator device, said quartz oscillator device having a variable capacity element, a storage device, and a quartz oscillator on which a temperature characteristic information thereof is displayed, said apparatus comprising:

a frequency adjusting device having a temperature sensor for measuring a temperature of said quartz oscillator at a time when a frequency of said quartz oscillator is adjusted to a predetermined frequency by said variable capacity element, the measured temperature of said quartz oscillator being stored in said storage device; and a temperature-compensating-data writing device having means for reading the displayed information, and a plurality patterns of standard temperature-compensating-datum, said temperature-compensating-data writing device being operable to select temperature compensating data optimally suited to the displayed temperature characteristic of said quartz oscillator which has been read by said reading means, and means for calculating a frequency deviation caused by a difference between the temperature of said quartz oscillator at the time of adjustment thereof and a standard temperature, said writing device is also operable to store the temperature compensating data, including the frequency deviation, in said storage device, wherein the temperature characteristic of said quartz oscillator is compensated on the basis of the temperature compensating data corrected for the frequency deviation.

2. The apparatus for adjusting a temperature compensated quartz oscillator device according to the claim 1, wherein said temperature characteristic information of said quartz oscillator is printed on said quartz oscillator in advance in the form of a bar code, and the reading means is a bar code reader.

3. The apparatus for adjusting a temperature compensated quartz oscillator device according to the claim 1, wherein the temperature sensor is a noncontact temperature sensor.

4. The apparatus for adjusting a temperature compensated quartz oscillator device according to the claim 1, wherein the calculating means is incorporated into said temperature-compensating-data writing device.

5. A temperature compensated quartz oscillator device comprising:

a variable capacity element, a quartz oscillator on which a temperature characteristic information thereof is displayed, and a storage device, said storage device storing a temperature of said quartz oscillator at a time when a frequency of said quartz oscillator is adjusted to a predetermined frequency by said variable capacity element, wherein by selecting a temperature compensating data optimally suited to the temperature characteristic of said quartz oscillator, based on the displayed temperature characteristic information, and calculating a frequency deviation caused by the difference between the temperature of said quartz oscillator at the time of adjustment thereof and a standard temperature by means of a calculating means, the temperature characteristic of said quartz oscillator is compensated on the basis of the temperature compensating data corrected for the frequency deviation.

6. The temperature compensated quartz oscillator device according to the claim 5, wherein the temperature compensated quartz oscillator device is incorporated into a portable telephone terminal.

7. A method for adjusting a temperature compensated quartz oscillator device, said quartz oscillator device including a variable capacity element, a quartz oscillator on which a temperature characteristic information thereof is displayed, and a storage device, said method comprising the steps of:

setting a frequency of the quartz oscillator to a predetermined frequency by adjusting said variable capacity element;

measuring a temperature of the quartz oscillator at the time of adjustment of said variable capacity element;

reading a temperature characteristic of said quartz oscillator from the temperature characteristic information thereof displayed on said quartz oscillator;

selecting temperature compensating data, which is optimally suited to the temperature characteristic of said quartz oscillator, from a plurality of temperature compensating data patterns stored in advance;

calculating a frequency deviation caused by a difference between the temperature of said quartz oscillator at the time of adjustment thereof and a standard temperature; and compensating the temperature characteristic of said quartz oscillator based upon the temperature compensating data corrected for the frequency deviation.

8. The method for adjusting a temperature compensated quartz oscillator device according to claim 7, wherein the temperature characteristic information is displayed as a bar code, and the reading step includes reading said bar code.

* * * * *